United States Patent [19]

Eberbach

[11] Patent Number: 4,578,809

[45] Date of Patent: Mar. 25, 1986

[54] DIHEDRAL LOUDSPEAKERS WITH VARIABLE DISPERSION CIRCUITS

[76] Inventor: Steven J. Eberbach, 950 Fountain, Ann Arbor, Mich. 48104

[21] Appl. No.: 457,035

[22] Filed: Jan. 10, 1983

[51] Int. Cl.$^4$ .............................................. H03G 5/00
[52] U.S. Cl. ....................................... 381/99; 381/24
[58] Field of Search ................ 381/17, 24, 98, 99, 381/102, 101

[56] References Cited

U.S. PATENT DOCUMENTS

| | | | |
|---|---|---|---|
| 4,037,051 | 7/1977 | Fuselier | 381/99 |
| 4,074,070 | 2/1978 | Gaus | 381/99 |
| 4,218,583 | 8/1980 | Poulo | 381/99 |
| 4,220,832 | 9/1980 | Nagel | 179/115.5 DV |

*Primary Examiner*—Forester W. Isen
*Attorney, Agent, or Firm*—James M. Deimen

[57] ABSTRACT

A dihedral loudspeaker for use in mirror image stereophonic loudspeaker systems combines a pair of coaxial drivers with variable dispersion circuits and a high frequency delay network. The variable dispersion circuits decrease the amplitude of the electric signal to the indirect or ambient firing coaxial drivers relative to the direct firing drivers. Each coaxial driver combination comprises a high frequency driver in front of a low or mid-range frequency driver. The pair of coaxial driver combinations in each loudspeaker are substantially identical and each is effectively almost a point source of sound energy. The pair of coaxial drivers are located in dihedral baffles of the loudspeaker approximately the interaural distance apart. The variable dispersion circuits allow the loudspeakers to be adjusted such that listeners outside of the area between and in front of the loudspeakers hear an illusion of the sound image coming from the space between the loudspeakers.

7 Claims, 4 Drawing Figures

4,578,809

DIHEDRAL LOUDSPEAKERS WITH VARIABLE DISPERSION CIRCUITS

BACKGROUND OF THE INVENTION

The field of the invention pertains to electroacoustic loudspeakers for home and concert stereophonic music reproduction. In particular, the invention is directed to modifications of such loudspeakers to reduce the effect of the loudspeaker's electroacoustic configuration on the sound signal and thereby to produce a more accurate reproduction of music.

Recently, a variety of loudspeakers have been introduced that are directed to creation of ambient sound fields in addition to the direct sound fields generated by drivers directed at the expected listener position. Such loudspeakers incorporate rear facing drivers and upward or downward facing drivers.

Loudspeakers such as the "TIME WINDOW" from DCM CORPORATION of Ann Arbor, Mich. employ a prismatic or dihedral front with drivers in both panels. The drivers in the panels facing the listener provide the direct sound field and the drivers in the panels facing away from the listener provide the ambient or reflected sound field.

Reference is made to applicant's U.S. Pat. No. 4,315,102 which discloses improvements in electric crossover circuitry and methods to adjust loudspeakers for flatter amplitude and phase response within and beyond the pass bands of the electroacoustic networks. Reference is also made to applicant's pending U.S. application Ser. No. 146,254 which discloses improvements in crossovers incorporating delay lines, coaxial drivers and methods to adjust loudspeakers for flatter amplitude and phase response within and beyond the pass bands of the electroacoustic networks. The above applicant's disclosures are incorporated herein by reference.

U.S. Pat. No. 2,053,364 and U.S. Pat. No. 2,259,907 illustrate early forms of coaxial high and low frequency driver combinations for incorporation in a loudspeaker. The high frequency driver is located in front of the low frequency driver which unfortunately accentuates the difference in time of arrival at the listener's ear of sounds generated simultaneously by the two drivers of the coaxial driver.

The delay lines disclosed in applicant's above noted pending application are directed toward overcoming some of the distortions in the acoustic signals reaching the ear that arise from the use of coaxial drivers. The disclosure below comprises further improvements to the direct and ambient time/ space coherent sound approach pioneered by applicant with the original "TIME WINDOW" loudspeakers and with other loudspeaker products of DCM CORPORATION.

SUMMARY OF THE INVENTION

The invention comprises improvements in dihedral loudspeakers for use in mirror image stereophonic loudspeaker systems. In a loudspeaker a pair of coaxial electroacoustic drivers are positioned in the two dihedral baffles, one coaxial driver being positioned for direct sound to the listener and the other for ambient sound. The crossover circuits for the drivers include adjustable variable dispersion circuits to decrease the amplitude of the electric signals to the ambient drivers relative to the direct sound drivers and to modify the phase relationships among the drivers.

It is an object of the invention to alter the spatial characteristics of the sound image perceived by the listener whether he be sitting at the central plane between the stereophonic loudspeakers or spaced therefrom. The variable dispersion circuits allow the loudspeakers to be adjusted such that listeners outside of the area between and in front of the loudspeakers hear an illusion of the sound image coming from the space between the loudspeakers. The alteration of the spatial characteristics of the sound image is accomplished without altering the perceived frequency balance of the direct sound field.

With the variable dispersion circuits the optimum control setting to suit the taste of the listener can be easily determined. The variable dispersion circuits can be fine tuned for the single listener interested in close critical listening or, alternatively, the variable dispersion circuits can be adjusted to provide the best overall sound quality for all persons in a large group about the loudspeakers. Regardless of the setting of the variable dispersion circuits an accurate impulse response is maintained toward the critical listener at the plane between the loudspeakers.

Applicant has empirically determined by laboratory testing that the variable dispersion circuits disclosed do not substantially vary the tonal balance of the loudspeaker despite the change in spatial character of the sound as the ratio of sound energy from the ambient drivers to the direct drivers changes.

DESCRIPTION OF THE PREFERRED EMBODIMENT

Figure 1:
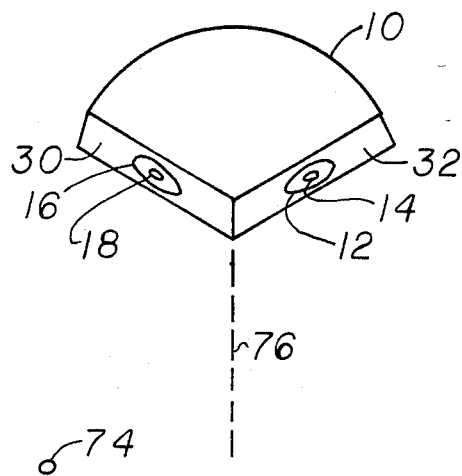
FIG. 1 is a top view of a pair of dihedral loudspeakers.
Figure 1:
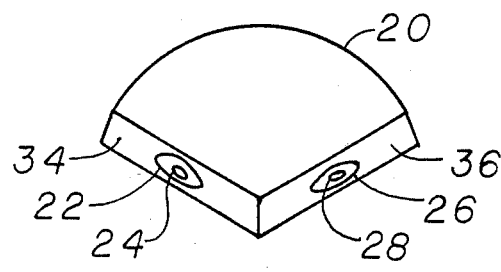
Figure 2:
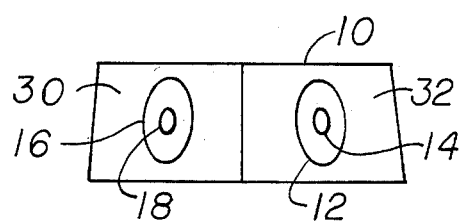
FIG. 2 is a front view of the dihedral loudspeakers of FIG. 1.
Figure 2:
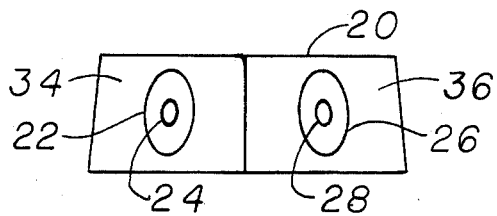

In FIGS. 1 and 2 are illustrated schematically a pair of stereophonic mirror imaged dihedral loudspeakers. The left loudspeaker 10 includes direct sound coaxial drivers 12 and 14 and indirect or ambient coaxial drivers 16 and 18. Similarly, the right loudspeaker 20 includes direct sound coaxial drivers 22 and 24 and indirect or ambient coaxial drivers 26 and 28. The coaxial drivers are mounted in dihedral baffles 30, 32, 34 and 36 respectively which form panels of the loudspeaker 10 and 20 cabinets.

The direct sound coaxial drivers 12, 14 and 22, 24 are generally aimed at the expected critical listener position 38 given on a vertical plane 40 equidistant between the loudspeakers. The ambient sound coaxial drivers 16, 18 and 26, 28 are directed generally away from the expected listener position 38 to specifically create an ambient sound field.

The dihedral loudspeakers 10 and 20 shown with coaxial drivers in the dihedral panels may be full range loudspeakers or mid-range and high frequency drivers that can be coupled with low frequency loudspeakers (not shown). Illustrated in FIGS. 3 and 4 are mid-range and high frequency crossover networks incorporating the variable dispersion circuits of applicant for use with the mid-range and high frequency version of the loudspeakers.

Figure 3:
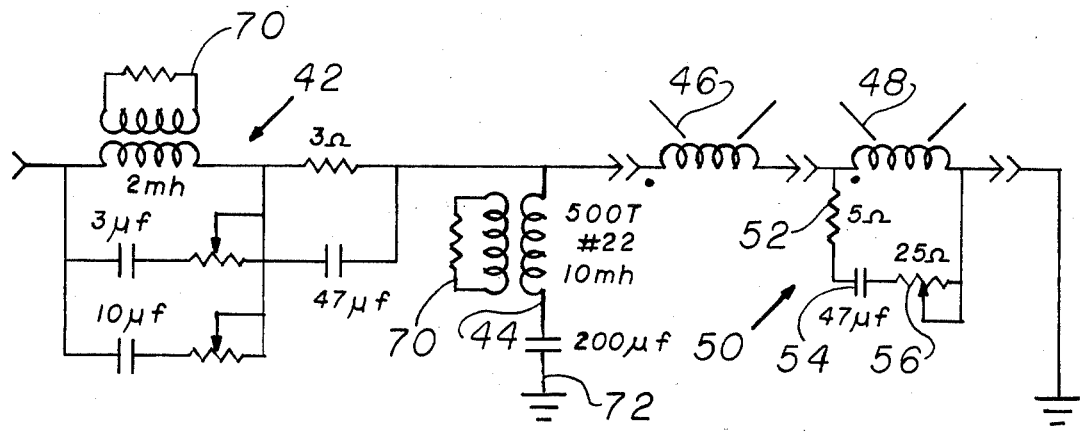
FIG. 3 is a crossover filter circuit for the mid-range drivers of the dihedral loudspeakers; and, FIG. 4 is a crossover filter and delay network for the high frequency drivers of the dihedral loudspeakers.

In FIG. 3 the circuit comprises a mid-range filter generally denoted by 42, a series resonant circuit 44 and a pair of mid-range electroacoustic drivers 46 and 48 which correspond to either drivers 12 and 16 respectively or 22 and 26 respectively. In parallel about the ambient or indirect mid-range driver 48 is a variable dispersion circuit generally denoted by 50 including a fixed resistor 52, a capacitor 54 and a variable resistor 56.

Figure 4:
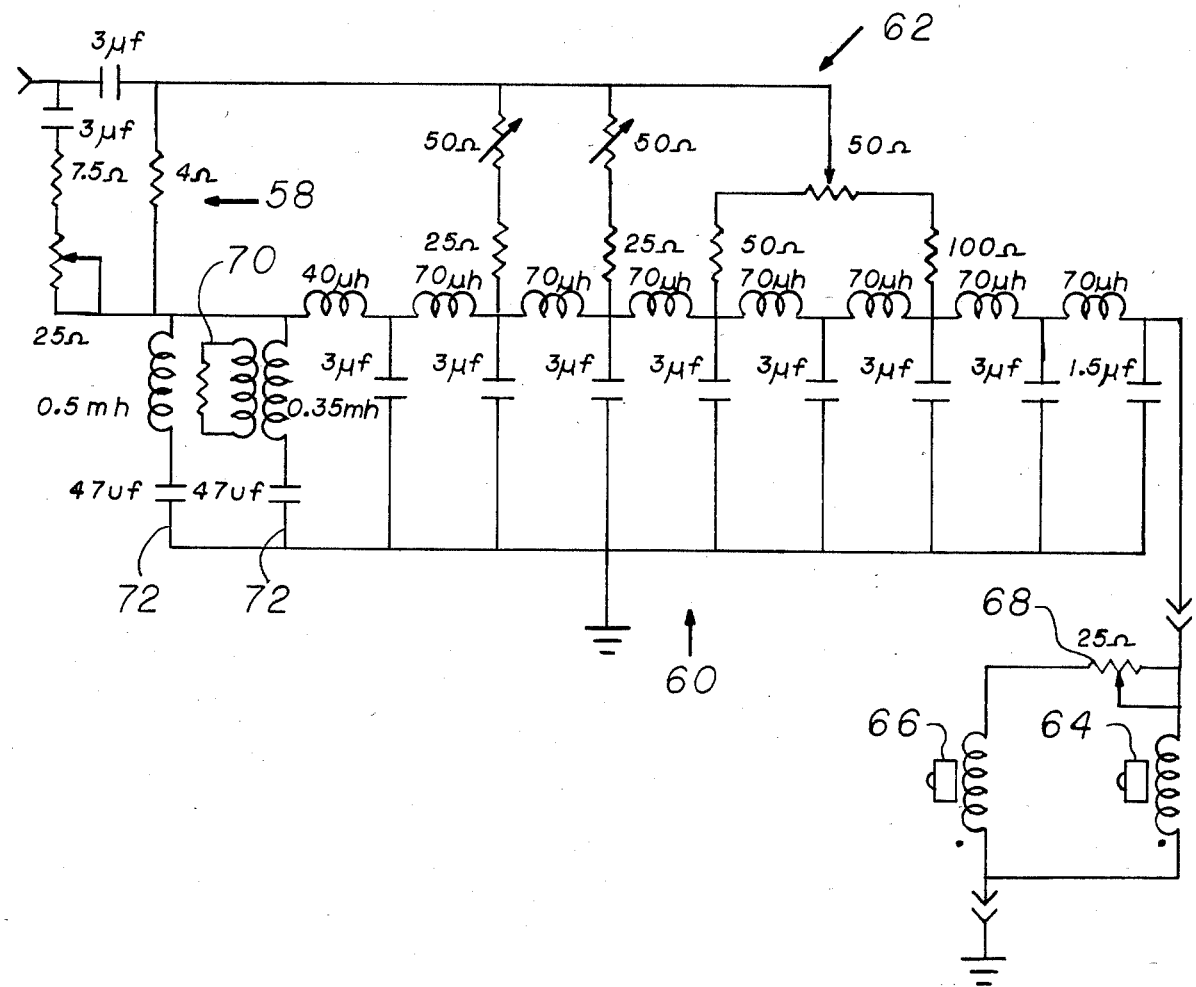

In FIG. 4 the circuit comprises a high pass filter generally denoted by 58, a delay network generally denoted by 60 and a feed forward network generally denoted by 62. The basic principle behind the feed forward circuit is disclosed in applicant's pending application Ser. No. 384,193. In the high frequency circuit the high frequency drivers 64 and 66 are connected in parallel to ground with driver 64 corresponding to either direct high frequency driver 14 or 24 and driver 66 corresponding to either ambient high frequency driver 18 or 28. In series with the ambient driver 66 only is a variable resistor 68 forming a variable dispersion circuit with the ambient driver 66.

In addition to the circuit features of FIGS. 3 and 4 noted above, both crossovers include coupled secondary circuits 70 and series resonant shunts 72 as important features of the crossovers. The purposes of these secondary circuits 70 and series resonant shunts 72 are disclosed in applicant's above noted U.S. Pat. No. 4,315,102 and application Ser. No. 146,254. These crossover circuits have enabled applicant to achieve superior amplitude-frequency and phase-frequency response from coaxial driver combinations. Reference is also made here to applicant's co-pending application entitled Loudspeaker Drivers Incorporating Slotted Sound Absorbent Baffles for additional improvements to coaxial driver combinations. The improvements to coaxial driver combinations disclosed herein, however, are applicable to non-coaxial driver combinations although the improvements are believed by applicant to be most effective with coaxial drivers, in particular with dihedral mounted coaxial drivers.

The variable dispersion circuits disclosed herein make noticeable and important improvements to the overall sound quality of the loudspeakers because the other elements of the crossover circuits so carefully control the tonal balance and time coherence of the individual coaxial drivers. Less carefully constructed and adjusted loudspeakers would mask the improvement in ambient sound quality generated by the ambient coaxial drivers and variable dispersion circuits.

Applicant believes that a "comb filter" effect is at least a part of the reason that the variable dispersion circuits enhance the ambient sound field of the loudspeaker. It is known that musical signals (sound) passed through a comb filter can be substantially altered in spatial quality without altering the tonal balance of the sound as much as would be expected from an analysis of the amplitude-frequency response.

Experimentally applicant has found that spacing the direct and ambient drivers approximately the interaural distance apart in a loudspeaker produces the minimum subjective alteration of perceived tonal balance and the most natural illusion of distance. With applicant's variable dispersion circuits the listener can adjust the perceived distance from the loudspeaker by adjusting the ratio of direct to ambient field amplitude. This is accomplished by adjusting the separate variable resistors 56 and 68 in each loudspeaker.

To a listener in the ambient field such as at 74 in FIG. 1 the nearer loudspeaker 10 can be made to sound further away than the other loudspeaker 20. A listener moving from 38 (direct sound field) to 74 (ambient sound field) hears that the loudspeaker 10 is moving farther away creating the illusion that the stereo sound image between the loudspeakers is stabilized at an apparent position between the loudspeakers.

In operation the variable dispersion circuit 50 of the mid-range crossover includes the capacitor 54 to cause the response of the direct driver 46 to slightly lead and that of the ambient driver 48 to slightly lag. The phase lag of driver 48 creates an additional cusp in the amplitude-frequency response of the ambient sound field below the frequency range of the high frequency drivers, effectively extending the desired "comb filter" effect of the ambient high frequency driver down into the mid-range frequencies below 2 kilohertz. The phase lead of driver 46 minimizes the undesirable interference effects which would normally occur between the two mid-range drivers in the direct sound field without capacitor 54.

The high frequency drivers are connected to an impedance substantially that of the two high frequency drivers. Thus, varying the output of the ambient high frequency driver 66 by varying the variable dispersion resistor 68 slightly varies the output of the direct high frequency driver 64. The sound output measured in a plane 76 bisecting the dihedral baffle angle shows little or no change of loudspeaker combined output as the resistor 68 is varied. A minimum variation in tonal balance has been verified experimentally as is to be expected since the total energy-frequency balance integrated over a sphere remains substantially constant regardless of the resistor 68 setting of applicant's circuit.

In summary the amplitude-frequency response in the direct sound field is smooth and the amplitude-frequency response in the ambient field includes periodic dips resembling a "comb filter" response. The subjective effect in combination with the other features of the drivers (interaural spacing and dihedral positioning) is the subjective varying of the distance of the sound source without changing the perceived tonal balance of the sound image. Varying of the dispersion circuits causes a listener directly in front at 38 to notice a movement of the perceived sound image forward and backward. The ambient field listener at 74 perceives a shifting of the sound image to and from a location between the loudspeakers.

Applicant believes the explanation for the shifting of the stereo sound image arises from the interference with or defeat of the time-localization cue in the listener's mind by the "comb filter" effect in the ambient sound. The effect is to cause the nearer speaker to sound further away to a listener in the ambient sound field thereby re-establishing the stereo illusion to the listener.

The center listening position will, of course, always provide the best "stereo image", because the on-center listener hears both level and time difference cues stored in the recording. Listeners off center lose the time cues, but can still hear the level differences between the two channels when the dispersion controls are set properly. The sonic effect is that the "stereo sound stage" remains between the speakers, but is "playing toward" a listener seated on center between the speakers.

I claim:

1. A loudspeaker comprising two coaxial driver combinations, each including a high frequency driver and a lower frequency driver, the two coaxial driver combinations located at a dihedral angle relative to each other to direct sound energy away from each other, and the two coaxial driver combinations being substantially the interaural distance apart, a first crossover circuit connected to the pair of high frequency drivers and a second crossover circuit connected to the pair of lower frequency drivers, means to control the amplitude of one high frequency driver relative to the other high frequency driver and means to control the amplitude of one lower frequency driver relative to the other lower frequency driver, wherein the lower frequency drivers are in series with each other and with the lower frequency crossover circut, said means to control the amplitude of one lower frequency driver comprising a capacitive shunt and variable resistance means in the shunt, said shunt across said one lower frequency driver, and wherein the high frequency drivers are electrically in parallel with each other, the means to control the amplitude of one high frequency driver comprising variable resistance means in series with said one high frequency driver.

2. The loudspeaker of claim 1 including means to cause one lower frequency driver to lead and the other lower frequency driver to lag the phase angle of the electric input signal to the pair of lower frequency drivers.

3. The loudspeaker of claim 1 including means to produce a dip in the amplitude-frequency response of one of the lower frequency drivers only.

4. The loudspeaker of claim 1 wherein the lower frequency drivers are electrically in series with each other and with the lower frequency crossover circuit, said means to control the amplitude of one lower frequency driver comprising a reactive shunt across said one lower frequency driver.

5. The loudspeaker of claim 4 wherein the high frequency drivers are electrically in parallel with each other, the means to control the amplitude of one high frequency driver comprising resistance means in series with said one high frequency driver.

6. The loudspeaker of claim 1 wherein the high frequency crossover circuit includes a delay network in series with said electrically parallel high frequency drivers.

7. A pair of loudspeakers as claimed in claim 1 wherein a coaxial combination of high frequency and lower frequency drivers including variable resistance in series therewith or thereacross respectively is in the left most baffle of one loudspeaker and a second combination is in the right most baffle of the other loudspeaker, the two loudspeakers thereby forming a mirror image loudspeaker pair.

* * * * *